(12) United States Patent
Nair et al.

(10) Patent No.: US 11,488,880 B2
(45) Date of Patent: Nov. 1, 2022

(54) ENCLOSURE FOR AN ELECTRONIC COMPONENT

(71) Applicant: Intel Corporation, Santa Clara, CA (US)

(72) Inventors: Vijay K. Nair, Mesa, AZ (US); Digvijay A. Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/619,061

(22) PCT Filed: Jun. 30, 2017

(86) PCT No.: PCT/US2017/040517
§ 371 (c)(1),
(2) Date: Dec. 3, 2019

(87) PCT Pub. No.: WO2019/005171
PCT Pub. Date: Jan. 3, 2019

(65) Prior Publication Data
US 2020/0098655 A1 Mar. 26, 2020

(51) Int. Cl.
*H01L 23/10* (2006.01)
*H01L 23/498* (2006.01)
(Continued)

(52) U.S. Cl.
CPC .......... *H01L 23/10* (2013.01); *H01L 21/4817* (2013.01); *H01L 23/055* (2013.01);
(Continued)

(58) Field of Classification Search
CPC ... H01L 23/10; H01L 23/055; H01L 23/3128; H01L 23/3675; H01L 23/49827;
(Continued)

(56) References Cited

U.S. PATENT DOCUMENTS 5,219,794 A * 6/1993 Satoh ...................... H01L 21/50
228/121
5,637,920 A * 6/1997 Loo ........................ H01L 21/563
257/700
(Continued)

OTHER PUBLICATIONS

PCT Application No. PCT/US2017/040517 Filing date Jun. 30, 2017, Vijay K. Nair International Search Report dated Apr. 16, 2018, 17 Pages.

*Primary Examiner* — Peniel M Gumedzoe
(74) *Attorney, Agent, or Firm* — Schwabe, Williamson & Wyatt, P.C.

(57) ABSTRACT

Enclosure technology for electronic components is disclosed. An enclosure for an electronic component can comprise a base member and a cover member disposed on the base member such that the cover member and the base member form an enclosure for an electronic component. In one aspect, the base member can have at least one via extending therethrough. The at least one via can be configured to electrically couple an enclosed electronic component with another electronic component external to the enclosure. In another aspect, the cover member can include a protrusion, a receptacle, or both, and the base member can include a mating protrusion, receptacle, or both to facilitate proper alignment of the cover member and the base member. Electronic device packages and associated systems and methods are also disclosed.

23 Claims, 6 Drawing Sheets

(51) Int. Cl.
*H01L 23/055* (2006.01)
*H01L 23/552* (2006.01)
*H01L 23/367* (2006.01)
*H01L 21/48* (2006.01)
*H01L 23/31* (2006.01)
*H01L 25/065* (2006.01)
*H01L 23/538* (2006.01)

(52) U.S. Cl.
CPC ...... *H01L 23/3128* (2013.01); *H01L 23/3675* (2013.01); *H01L 23/49827* (2013.01); *H01L 23/5384* (2013.01); *H01L 23/552* (2013.01); *H01L 25/0655* (2013.01)

(58) Field of Classification Search
CPC ............... H01L 23/5384; H01L 23/552; H01L 21/4817; H01L 25/0655
See application file for complete search history.

(56) References Cited

U.S. PATENT DOCUMENTS

| | | | | |
|---|---|---|---|---|
| 6,008,536 A | * | 12/1999 | Mertol | H01L 23/367 257/704 |
| 6,282,096 B1 | * | 8/2001 | Lo | H01L 23/04 361/704 |
| 7,388,284 B1 | * | 6/2008 | Zhang | H01L 23/10 257/704 |
| 8,897,019 B1 | | 11/2014 | Shimamura et al. | |
| 10,290,613 B2 | * | 5/2019 | Uzoh | H01L 23/49811 |
| 2002/0079593 A1 | | 6/2002 | Huang | |
| 2004/0178500 A1 | * | 9/2004 | Usui | H01L 24/97 257/734 |
| 2004/0251476 A1 | | 12/2004 | Strobel et al. | |
| 2007/0200210 A1 | | 8/2007 | Zhao et al. | |
| 2009/0057884 A1 | * | 3/2009 | Too | H01L 25/0655 257/723 |
| 2009/0294938 A1 | * | 12/2009 | Chen | H01L 24/19 257/676 |
| 2011/0096505 A1 | | 4/2011 | Inoue | |
| 2011/0215470 A1 | * | 9/2011 | Chen | H01L 24/97 257/738 |
| 2012/0280374 A1 | | 11/2012 | Choi et al. | |
| 2014/0017843 A1 | | 1/2014 | Jung et al. | |
| 2014/0166352 A1 | | 6/2014 | Ueda et al. | |
| 2015/0235990 A1 | * | 8/2015 | Cheng | H01L 23/13 257/712 |
| 2015/0255429 A1 | * | 9/2015 | Katkar | H01L 25/0652 257/774 |
| 2015/0318267 A1 | * | 11/2015 | Yu | H01L 21/02274 257/774 |
| 2016/0300799 A1 | * | 10/2016 | Han | H01L 23/552 |
| 2017/0117229 A1 | | 4/2017 | Kumbhat et al. | |
| 2017/0372979 A1 | * | 12/2017 | Gandhi | H01L 25/0655 |

\* cited by examiner

ENCLOSURE FOR AN ELECTRONIC COMPONENT

PRIORITY INFORMATION

This application is a 371 U.S. national stage entry of PCT Application Serial No. PCT/US2017/040517, filed Jun. 30, 2017, which is incorporated herein by reference in its entirety.

TECHNICAL FIELD

Embodiments described herein relate generally to enclosures for electronic components, and more particularly to hermetically sealed and electromagnetically shielded enclosures.

BACKGROUND

Humidity can give rise to reliability issues for many electronic device packages, particularly for ball grid array (BGA) packages that include flip chips (FC BGA packages). During surface mounting of FC BGA packages to a circuit board (e.g., a motherboard), the FC BGA package is exposed to reflow (preconditioning) in a humid condition. The humidity can prove detrimental to the FC BGA package. For example, underfill/solder resist (UF/SR) delamination can occur and lead to a solder crack and/or inter-level dielectric (ILD) delamination, either of which can cause serious electrical failure of the FC BGA package.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open-ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects, structures, or components are in physical contact with one another. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

A typical solution for the humidity-based problem afflicting FC BGA packages is to use ceramic packages as enclosures. However, electromagnetic interference (EMI), RF shielding, and adequate thermal dissipation of the various dies are also often needed, particularly in multi-chip packaging. Thermal dissipation is an important requirement for high power dies, such as application processors (APU) and RF front-end ICs. RF MEMs devices must be hermetically sealed to maintain the oscillation frequency of the resonators incorporated in the RF MEMS devices. Currently, separate solutions are implemented for RF shielding, thermal dissipation, and hermetic sealing of FC BGA packages and multi-chip packages.

Accordingly, an enclosure for an electronic component is disclosed that provides a hermetic seal, an EMI shield, and a thermal dissipation solution. In one aspect, the enclosure can be utilized for multiple electronic components in a single package. In one example, an enclosure for an electronic component in accordance with the present disclosure can comprise a base member having at least one via extending therethrough. The enclosure for an electronic component can also comprise a cover member disposed on the base member. The base member and the cover member can form an enclosure for an electronic component. The at least one via can be configured to electrically couple an enclosed electronic component with another electronic component external to the enclosure. In another example, an enclosure for an electronic component in accordance with the present disclosure can comprise a base member to support an electronic component. The enclosure for an electronic component can also comprise a cover member configured to be disposed on the base member such that the cover member and the base member enclose the electronic component. The cover member can include a protrusion, a receptacle, or both, and the base member can include a mating protrusion, receptacle, or both to facilitate proper alignment of the cover member and the base member. Electronic device packages and associated systems and methods are also disclosed.

Figure 1:
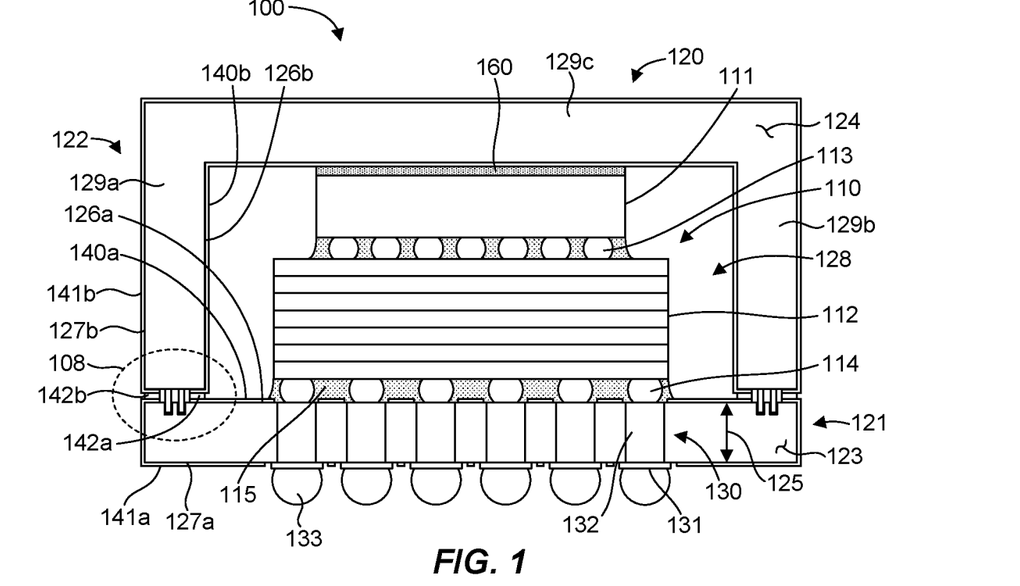
FIG. 1 illustrates a schematic cross-section of an electronic device package in accordance with an example embodiment.

Referring to FIG. 1, an exemplary electronic device package 100 is schematically illustrated in cross-section. The electronic device package 100 can include an electronic component 110 and an enclosure 120 for the electronic component. The enclosure 120 can include a base member 121 and a cover member 122. The electronic component 110 can be disposed on the base member 121, and the cover member 122 can be disposed on the base member 121 such that the cover member 122 and the base member 121 enclose the electronic component 110.

Figure 3:
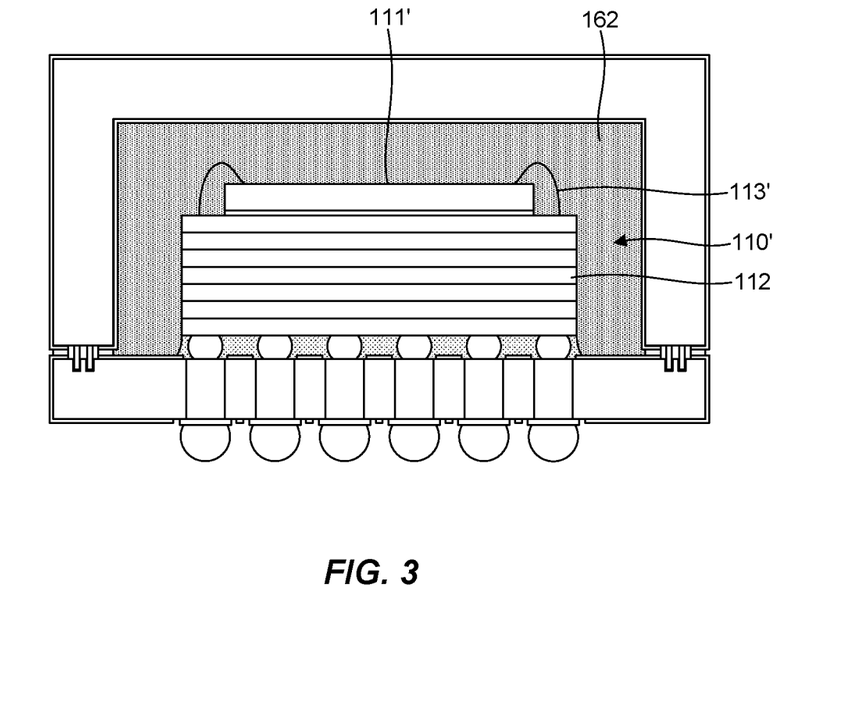
FIG. 3 illustrates a schematic cross-section of an electronic device package in accordance with an example embodiment.

The electronic component 110 can be any electronic device or component that may be included in an electronic device package, such as a semiconductor device (e.g., a die, a chip, a processor, computer memory, platform controller hub, etc.). In one embodiment, the electronic component 110 may represent an electronic device package (e.g., a flip chip package as shown in FIG. 1 or a conventional wire bond chip package 110' as shown in FIG. 3). The electronic component 110 may be, include, or be a part of a processor (e.g., a CPU, a GPU, etc.), a memory device (e.g., SRAM, DRAM, flash memory, EEPROM, etc.), an application specific integrated circuit (ASIC), a platform controller hub (PCH), a field programmable gate array (FPGA), a system on a chip (SOC) (e.g., an application processor (APU)), a system in a package (SIP), a package on a package (POP), or a modem in some embodiments. In some embodiments, the electronic component can include a component for wireless communication applications, such as RF integrated circuits (e.g., digital or analog RF ICs), RF MEMS, etc.

In some embodiments, the electronic component 110 can include a die or a chip 111 (e.g., a flip chip as shown in FIG. 1 or a conventional chip 111' as shown in FIG. 3) disposed on a package substrate 112. The package substrate 112 may include typical substrate materials. For example, the package substrate 112 may comprise as an epoxy-based laminate substrate having a core and/or build-up layers or coreless substrate. The package substrate 112 may include other suitable types of substrates in other embodiments. For example, the substrate can be formed primarily of any suitable semiconductor material (e.g., a silicon, gallium, indium, germanium, or variations or combinations thereof, among other substrates), one or more insulating layers, such as glass-reinforced epoxy, such as FR-4, polytetrafluoroethylene, cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in printed circuit boards (PCBs).

The die or chip 111 can be electrically coupled to the package substrate 112 using interconnect structures 113 (e.g., the illustrated solder balls or bumps in FIG. 1 and/or the wire bonds 113' in FIG. 3) configured to route electrical signals between the die or chip 111 and the package substrate 112. In some embodiments, the interconnect structures 113 may be configured to route electrical signals such as, for example, I/O signals and/or power or ground signals associated with the operation of the die or chip 111. The die or chip 111 can have electrical interconnect interfaces, such as pads (not shown), to interface and form electrical connections with the interconnect structures 113.

The package substrate 112 may include electrical routing features (not shown) configured to route electrical signals to or from the die or chip. The electrical routing features may be internal and/or external to the package substrate 112. For example, in some embodiments, the package substrate 112 may include electrical routing features such as pads, vias, and/or traces as commonly known in the art configured to receive the interconnect structures 113 (e.g., solder balls or bumps in FIG. 1 or the wire bonds 113' in FIG. 3) and route electrical signals to or from the die or chip 111. The pads, vias, and traces of the package substrate 112 can be constructed of the same or similar electrically conductive materials, or of different electrically conductive materials.

The package substrate 112 can be supported by the base member 121. In one aspect, package substrate 112 can be configured to facilitate electrically coupling the electronic component 110 with an external electronic component, such as the base member 121, to further route electrical signals and/or to provide power. The electronic component 110 can include interconnects, such as solder balls 114, for electrically coupling the electronic component 110 with an external electronic component (e.g., the base member 121). In one aspect, the interconnect of the package substrate 112 to the base member 121 with solder balls 114 can be a second level interconnect. In some embodiments, underfill material 115 (e.g., an epoxy) can be disposed about the solder balls 114 between the electronic component 110 and the base member 121 to enhance shock performance and protect the electronic component 110 from damage during solder reflow.

The base member 121 may include electrical routing features 130 to electrically couple the electronic component 110 with another electronic component external to the enclosure, such as via another substrate (e.g., a circuit board such as a motherboard). Thus, the electrical routing features 130 can be configured to route electrical signals to or from the electronic component 110. The electrical routing features 130 may be internal and/or external to the base member 121. For example, in some embodiments, the base member 121 may include electrical routing features 130 such as pads 131, vias 132, and/or traces as commonly known in the art configured to receive the interconnect structures 114 (e.g., solder balls) and route electrical signals to or from the electronic component 110. The pads 131 can be located on top and bottom sides of the vias 132. The pads 131, vias 132, and traces of the base member 121 can be constructed of the same or similar electrically conductive materials, or of different electrically conductive materials.

The base member 121 and the cover member 122 can be constructed of any suitable material. The base member 121 and the cover member 122 can be constructed of structural materials 123, 124 that provide the general shape or form of the members. In some embodiments, the base member 121 and the cover member 122 are made primarily of a ceramic structural material. Any suitable ceramic material can be utilized, such as a low temperature co-fired ceramic (LTCC). In other embodiments, the base member 121 and/or the cover member 122 can be made of a metal material, such as copper, aluminum, steel, etc. In one aspect, the vias 132 can extend through the structural material 123 of the base member 121 (e.g., through a thickness 125 of the base member 121) to electrically couple with the electronic component 110. The vias 132 can have any suitable configuration, such as solid or hollow. For example, a hollow via may be plated only along an outer boundary or border and therefore have a center portion that is devoid of conductive material. On the other hand, a solid via has no interior void or region without conductive material. The vias 132 can also have any suitable shape, such as a cylindrical shape. The vias 132 can be formed of any suitable electrically conductive material, such as a metal material (e.g., copper, aluminum, nickel, gold, etc.). In some embodiments, the vias 132 can be configured to accommodate high density interconnects (HDI), which may be beneficial for certain electronic components, such as CPU dies. In one embodiment, the vias 132 can extend through a ceramic structural material 123 of the base member 121. Thus, the vias 132 can be compatible with many types of flip chip packages. The protrusions 151a, 151b can have any suitable thickness or diameter 153. In one aspect, the structural material 123 of the base member 121 can have a thickness 125 of from about 100 µm to about 3 mm (e.g., about 1 mm in some embodiments), although greater thicknesses can be utilized if desired.

In one aspect, the base member 121 can be configured to facilitate electrically coupling the electronic device package 100 with an external electronic component, such as another substrate (e.g., a circuit board such as a motherboard) to further route electrical signals and/or to provide power. The electronic device package 100 can include interconnects, such as solder balls 133, coupled to the base member 121 for electrically coupling the electronic device package 100 with an external electronic component.

In one aspect, the electronic device package 100 can provide shielding for electromagnetic (e.g., RF) interference. For example, electrically conductive layers 140a, 140b can be disposed on interior surfaces 126a, 126b of the respective base and cover members 121, 122. In addition, or alternatively, electrically conductive layers 141a, 141b can be disposed on exterior surfaces 127a, 127b of the respective base and cover members 121, 122. Thus, the electrically conductive layers 140a, 140b together can form an electromagnetic interference shield layer on the interior of the electronic device package 100, and/or the electrically conductive layers 141a, 141b together can form an electromagnetic interference shield layer on the exterior of the electronic device package 100 to completely shield the electronic component 110 enclosed by the base and cover members 121, 122. Internal and/or external electromagnetic interference shield layers can be included as desired to meet RF shielding performance needs. For example, an internal shield layer may be suitable to shield the electronic component 110 enclosed by the base and cover members 121, 122, and an external shield layer may be suitable to shield the electrical routing features 130 (e.g., the pads 131, vias 132, etc.) associated with the base portion 121. It should be recognized that the electrically conductive layers 140a-b, 141a-b can be mixed and matched to achieve desired RF shielding performance. For example, the base member 121 may include only the outer electrically conductive layer 141a and the cover member 122 may include only the inner electrically conductive layer 140b. The electrically conductive layers 140a-b, 141a-b can be formed of any suitable electrically conductive material, such as copper, gold, etc. The electrically conductive layers 140a, 140b, 141a, 141b can have any suitable thickness. In one aspect, the electrically conductive layers 140a, 140b, 141a, 141b can have a thickness of from about 0.5 µm to about 3 µm (e.g., about 1 µm in some embodiments).

In one aspect, the electrically conductive layers 140a, 141a on the base member 121 can be spaced apart from the electrical routing features 130 (e.g., the pads 131, vias 132, etc.) and solder balls 114, 133 so that there is no contact or electrical communication between the electrically conductive layers 140a, 141a and the signal and/or power conducting components of the electronic device package 100. In other words, the electrically conductive layers 140a, 141a can be configured to surround the electrical routing features 130 and solder balls 114, 133 without making contact or being close enough for arcing to occur. Providing appropriate gaps between the electrically conductive layers 140a, 141a and the electrical routing features 130 and solder balls 114, 133 can avoid or prevent undesirable consequences, such as electrical short circuits and damage.

Although the base member 121 and the cover member 122 are each shown as being made of a single "piece" of structural material 123, 124 (e.g., ceramic), it should be recognized that the base member 121 and/or the cover member 122 can be made of multiple pieces of structural material. For example, multiple pieces of structural material (e.g., ceramic) can be combined (e.g., coupled by an adhesive) and one or more electrically conductive layers can be applied over the resulting composite structural part to achieve a suitable base or cover member as described herein. The electrically conductive layers can cover the junctions between adjacent pieces such that electromagnetic shielding is continuous.

Figure 2:
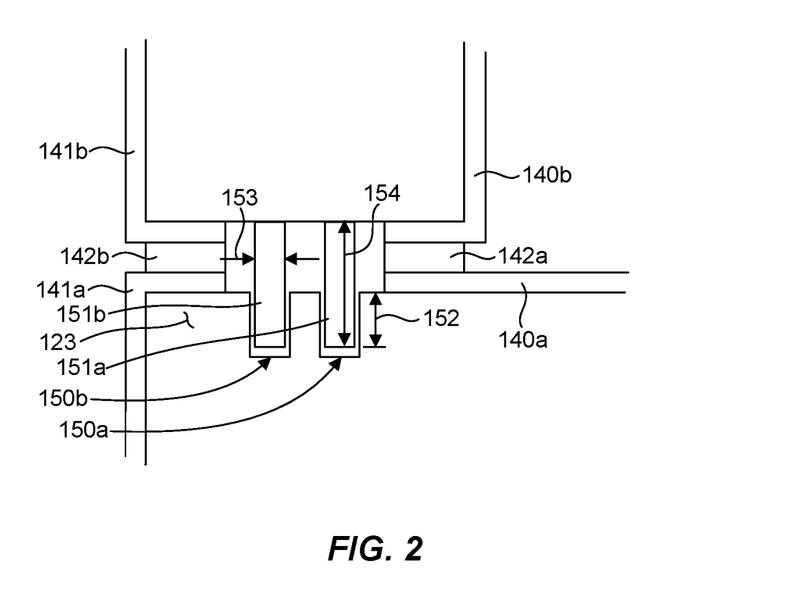
FIG. 2 illustrates a detail view of the electronic device package of FIG. 1.

The base member 121 and the cover member 122 can be mechanically coupled to one another to form an enclosure in any suitable manner, such as with a bond material 142a, 142b (e.g., a solder material, an epoxy, etc.). FIG. 2 shows a close-up of a junction of the base member 121 and the cover member 122 identified at 108 of FIG. 1. The bond material 142a, 142b can be disposed between adjacent interfacing portions of the base member 121 and the cover member 122. For example, the bond material 142a can be disposed between portions of the electrically conductive layers 140a-b, and the bond material 142b can be disposed between portions of the electrically conductive layers 141a-b. Therefore, the bond material 142a can be associated with an inside of the enclosure formed by the base member 121 and the cover member 122, and the bond material 142b can be associated with an outside of the enclosure formed by the base member 121 and the cover member 122. Utilizing solder and/or an electrically conductive adhesive as the bond material 142a 142b can provide continuous electrically conductive material to provide RF shielding performance without leakage of electromagnetic radiation.

In one aspect, the base member 121 and the cover member 122 can include features that facilitate proper alignment of the base member 121 and the cover member 122. For example, the base member 121 can include one or more receptacles 150a, 150b, and the cover member 122 can include one or more mating protrusions 151a, 151b. The receptacles 150a, 150b and protrusions 151a, 151b can have any suitable configuration. For example, the receptacles 150a, 150b can be configured as openings, such as slots, grooves, holes, etc. The protrusions 151a, 151b can be configured to be received within the receptacles 150a, 150b and can be configured as walls, posts, etc. The protrusions 151a, 151b can extend any suitable distance 152 into the base member 121 (e.g., into the structural material 123). In one aspect, the protrusions 151a, 151b can extend a distance 152 into the base member of from about 50 µm to about 1.5 mm (e.g., about 0.5 mm in some embodiments). As a general guideline, the distance 152 can be about half of the thickness 125 of the base member 121.

The protrusions 151a, 151b can have any suitable thickness or diameter 153. In one aspect, the protrusions 151a, 151b can have a thickness or diameter 153 of from about 50 µm to about 3 µm (e.g., about 0.5 mm or 1 mm in some embodiments). As a general guideline, a ratio of the thickness or diameter 153 to the height 154 of the protrusions 151a, 151b can be from 1:1 to 2:1. The protrusions 151a, 151b can be formed of any suitable material, such as a metal material (e.g., copper), a ceramic material, a polymer material, etc.

Although two receptacle/protrusion alignment features are shown, it should be recognized that any suitable number of alignment features can be utilized. Generally, more alignment features will improve the alignment of the base member 121 and the cover member 122. In addition, although the base member 121 is shown as having receptacles 150a, 150b and the cover member 122 is shown as having protrusions 151a, 151b, it should be recognized that the base member 121 and the cover member 122 can each have receptacles and/or protrusions, as desired.

In one aspect, the base member 121 and the cover member 122 can form a hermetic seal that protects the electronic component 110 against exposure to humidity, which may negatively impact the performance and reliability of the electronic component 110. For example, the base member 121 and the cover member 122 can interface via the alignment features (e.g., the receptacles 150a, 150b and protrusions 151a, 151b) and/or the bond material 142a, 142b to provide a hermetic seal. Thus, in addition to the other functions described above, the protrusions 151a, 151b and the bond material 142a, 142b can provide (redundant) shielding and contribute to hermetically sealing the enclosure. The conductive layers 140a-b, 141a-b may also contribute to providing a hermetic seal.

In one aspect, the electronic device package 100 can provide enhanced thermal dissipation for the electronic component 110. The base member 121 and/or the cover member 122 can be made of material having relatively high thermal conductivity, such as metal (e.g., copper) electrically conductive layers 140b, 141b and a ceramic (e.g., aluminum nitride) structural material 123, 124, which can facilitate heat transfer to cool high power electronic components. In some embodiments, the electronic component 110 can be thermally coupled to the cover member 122 by a thermally conductive material (e.g., a thermal interface material) 160 disposed between the cover member 122 and the electronic component 110. Any suitable thermal interface material can be utilized, such as a metal or polymer based material. The base member 121 and/or the cover member 122 can therefore act as a thermal dissipation solution for the electronic component 110. In some embodiments only the cover member 122 may be made of an electrically conductive material (e.g., a metal material such as copper). The base member 121 may be made of a material that is not electrically conductive to avoid shorting of routing lines and other such electrical features. In this case, thermal vias may be formed in the base member 121 to dissipate heat to the solder balls 133 and to an external substrate on which the electronic device package 100 is assembled. In other embodiments, routing lines and other such electrical features may be insulated from an electrically conductive base member material to avoid shorting or other electrical issues.

In one aspect, a mold compound material (162 in FIG. 3) can at least partially encapsulate or overmold the electronic component 110 inside the base member 121 and the cover member 122. For example, mold compound 162 can at least partially fill the enclosure to at least partially encapsulate the electronic component 110 (e.g., the mold compound 162 can be flush or even with the top surface of the electronic component 110). Any suitable mold compound or encapsulant material can be utilized, such as an epoxy. In some embodiments, the mold compound 162 can also serve as an underfill material for the electronic component 110.

Although not required, the base member 121 can have a flat configuration and the cover member can have a recess 128 to receive the electronic component 110. The recess 128 can have any suitable configuration. In the embodiment illustrated in FIG. 1, the recess 128 is at least partially defined by a C-shaped or U-shaped cross-sectional cover member 122 (e.g., vertical side walls 129a, b and a horizontal top wall 129c extending between the side walls 129a, 129b). Thus, the recessed cover member 122 and the flat base member 121 combine to form a cavity that encapsulates the electronic component 110. The embodiment of the electronic device package 100 illustrated in FIG. 1 has a cover member with only a single recess 128 enclosing a single electronic component 110. It should be recognized, however, that any suitable number of electronic components can be enclosed in a single recess.

Figure 4:
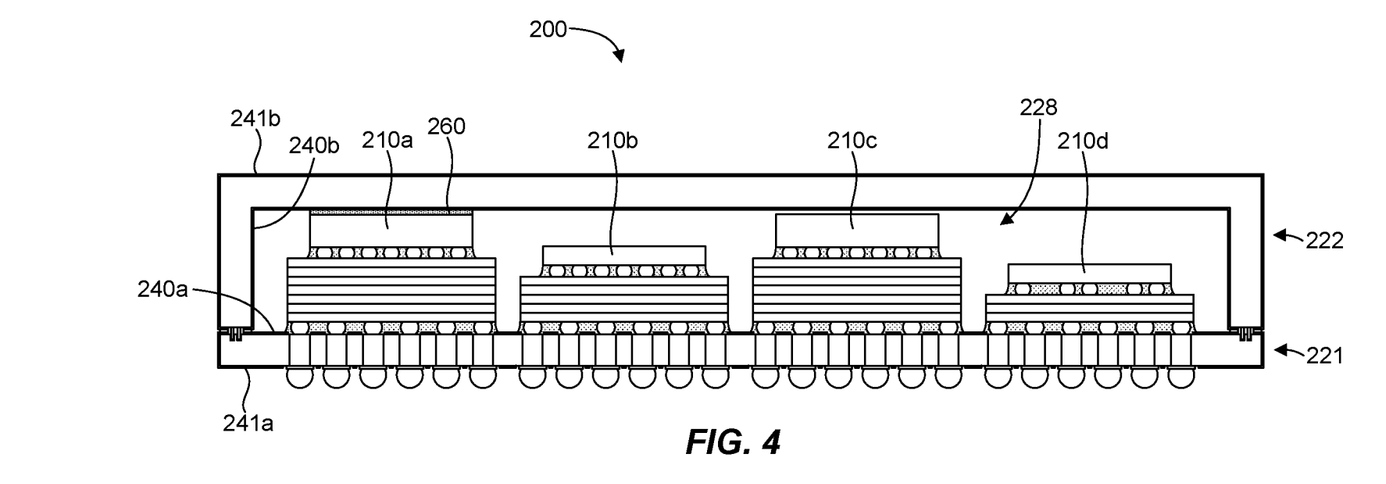
FIG. 4 illustrates a schematic cross-section of an electronic device package in accordance with an example embodiment.

For example, FIG. 4 illustrates an electronic device package 200 similar to the electronic device package 100 discussed above with a single recess 228. In this case, however, multiple electronic components 210a-d are disposed in the recess 228. The electronic components 210a-d can be of any suitable type. For example, the electronic component 210a can be an APU, the electronic component 210b can be a modem, the electronic component 210c can be an RF integrated circuit (e.g., a front-end IC), and the electronic component 210d can be an RF MEMS device. The electronic components 210a-d can therefore be different from one another and have individual characteristics, such as overall size (e.g., height, width, depth), first and second level interconnect characteristics (e.g., pitch, size, etc.), substrate characteristics and properties, etc. The base member 221 can be configured to accommodate the various electronic components 210a-d with regard to the appropriate size dimensions and interconnect characteristics. For example, the base member 221 can be sized to accommodate the overall "footprint" dimension of the group of electronic components 210a-d and have interconnect structures (e.g., pads and vias) that can couple with the individual electronic components 210a-d and provide electrical communication outside the enclosure. The cover member 222 can be configured to accommodate the various electronic components 210a-d with regard to the appropriate size dimensions (e.g., max height of the electronic components 210a-d and the overall footprint dimension of the group of electronic components 210a-d. In one aspect, the cover member 222 can be sized to accommodate the electronic component(s) with the greatest height dimension in order to receive all the electronic components 210a-d in a single recess 228. Thus, together the base member 221 and the cover member 222 can form an appropriately sized and configured single cavity or enclosure for the electronic components 210a-d.

The electronic device package 200 can include any suitable feature or component of the electronic device package 100 discussed above. For example, a thermal interface material 260 can be disposed between the electronic component 210a and the cover member 222, the base and cover members 221, 222 can include electrically conductive layers 240a-b, 241a-b to provide RF shielding, and the base and cover members 221, 222 can include alignment features and be mechanically coupled to one another in a manner that forms a hermetic seal. Thus, the electronic device package 200 can provide RF shielding, hermetic sealing, and a thermal solution for multiple electronic components 210a-d in a single enclosure or cavity. One benefit of this configuration is a reduced size or footprint compared to utilizing multiple enclosed electronic device packages that can each accommodate only a single electronic component.

Figure 5:
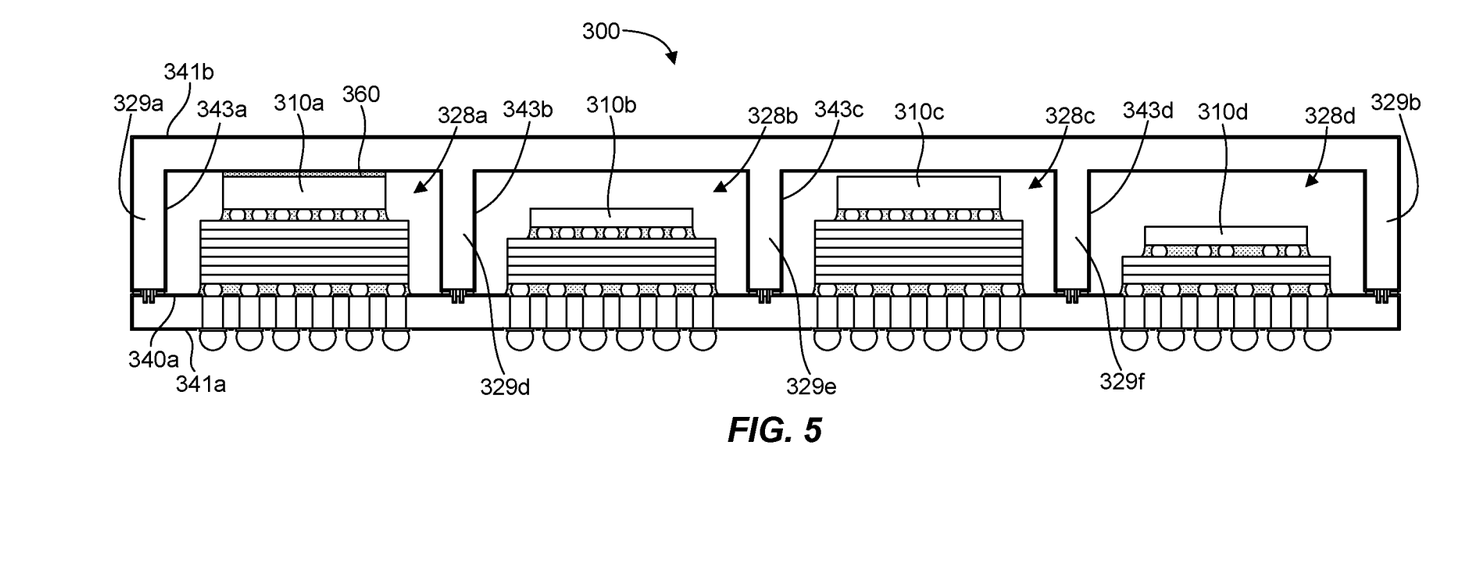
FIG. 5 illustrates a schematic cross-section of an electronic device package in accordance with an example embodiment.

In some cases, it may be desirable to shield electronic components from one another while taking advantage of the benefits provided by including multiple electronic components in a single enclosed package. FIG. 5 illustrates an electronic device package 300 similar to the electronic device package 200 discussed above with regard to being configured to accommodate multiple electronic components 310a-d. In this case, individual electronic components 310a-d are disposed in individual recesses 328a-d, respectively. The cover member 322 can include exterior side walls 329a, b and interior walls or partitions 329d-f that partially define the recesses 328a-d and serve to form individual cavities or compartments for the electronic components 310a-d. Electrically conductive layers 343a-d can be disposed on one or more interior surfaces of the recesses 328a-d to provide RF shielding for the various individual electronic components 310a-d. The cover member 322 can optionally include an electrically conductive layer 341b on exterior surfaces. The base member 321 can include an electrically conductive layer 340a on its interior surface operable with the electrically conductive layers 343a-d to provide RF shielded compartments for the electronic components 310a-d. The base member 321 can optionally include an electrically conductive layer 341a on exterior surfaces, which can be operable with the electrically conductive layer 341b of the cover member 322 to provide an outer or exterior shield against electromagnetic interference. Thus, together the base member 321 and the cover member 322 can form multiple shielded compartments for RF shielding the electronic components 310a-d from neighboring electronic components. Although each of the compartments is illustrated as being RF shielded, it should be recognized that only some (or none) of the compartments may be RF shielded.

The electronic components 310a-d can be of any suitable type and can differ from one another in individual characteristics, such as overall size (e.g., height, width, depth), first and second level interconnect characteristics (e.g., pitch, size, etc.), substrate characteristics and properties, etc. The cover member 322 can be configured to individually accommodate the various electronic components 310a-d with regard to the appropriate size dimensions (e.g., max height of the electronic components 310a-d and the overall footprint dimension of the group of electronic components 310a-d when accounting for the walls or partitions 329d-f that serve to define the individual recesses 328a-d. In one aspect, the cover member 222 can be sized to accommodate the dimensions of each individual electronic component (e.g., differently sized recesses 328a-d with regard to height, width, and/or depth dimensions based on the dimensions of the respective electronic components 310a-d). The base member 321 can be configured to accommodate the various electronic components 310a-d with regard to the appropriate interconnect characteristics and size dimensions when accounting for the walls or partitions 329d-f that serve to define the individual recesses 328a-d. For example, the base member 321 can be sized to accommodate the overall "footprint" dimension of the group of electronic components 310a-d when spaced apart in individual recesses 328a-d and have interconnect structures (e.g., pads and vias) that can couple with the individual electronic components 310a-d and provide electrical communication outside the enclosure. Thus, together the base member 321 and the cover member 322 can form multiple appropriately sized and configured cavities or compartments for enclosing the electronic components 310a-d.

The electronic device package 300 can include any suitable feature of component of the electronic device package 100 discussed above. For example, a thermal interface material 360 can be disposed between the electronic component 310a and the cover member 322, and the base and cover members 321, 322 can include alignment features and be mechanically coupled to one another in a manner that forms a hermetic seal. In some embodiments, one or more of the exterior walls 329a-b and interior walls 329d-f of the cover member 322 can include alignment features and/or be mechanically coupled to the base member 321 to provide individual alignment and sealing of the compartments. Thus, the electronic device package 300 can provide RF shielding, hermetic sealing, and thermal solutions for multiple electronic components 310a-d in individual compartments or cavities. This configuration can provide a reduced size or footprint compared to utilizing multiple enclosed electronic device packages that can each accommodate only a single electronic component.

Figure 6A:
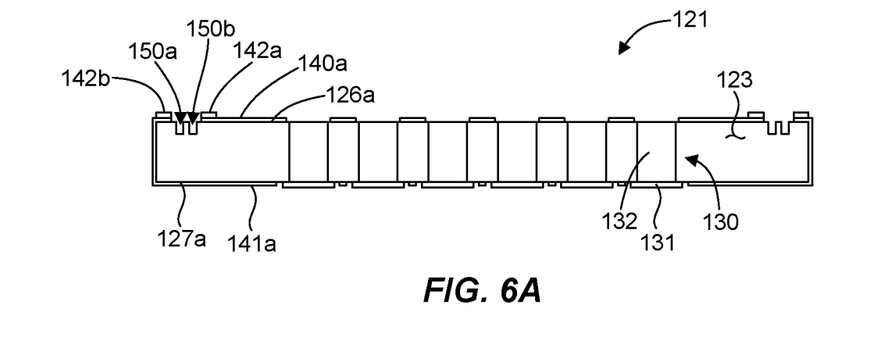
FIGS. 6A-6D illustrates aspects of a method for making an electronic device package in accordance with an example embodiment.

FIGS. 6A-6D illustrate aspects of a method for making an electronic device package in accordance with the present disclosure, such as the electronic device package 100. FIG. 6A schematically illustrates a side cross-sectional view of the base member 121. The electrical routing features 130 can be formed in any suitable manner. For example, the vias 132 can be formed by forming holes or openings in the structural material 123 of the base member 121. The holes or openings can be formed by any suitable technique or process, such as molding, drilling, boring, etc. Electrically conductive material (e.g., copper, aluminum, nickel, gold, etc.) can be disposed in the holes or openings to form the vias 132. Electrically conductive material can be disposed in the holes or openings utilizing any suitable process or technique, such as a deposition process (e.g., plating, printing, sputtering, spraying, etc.). Similarly, the pads 131 can be formed on top and/or bottom sides of the vias 132 by any suitable technique or process, such as a deposition process (e.g., plating, printing, sputtering, spraying, etc.). Patterning can be utilized to achieve a desired size, shape, and/or location of the pads 131.

The receptacles 150a, 150b can be formed in the structural material 123 of the base member 121 in any suitable manner, such as by molding, milling, drilling, etc. In addition, or alternatively, receptacles can be formed in the cover member 122.

Electrically conductive material, such as copper, can be disposed on the inner and outer (e.g., top and bottom) surfaces 126a, 127a of the structural material 123 of the base member 121 to form the electrically conductive layers 140a, 141a. Electrically conductive material can be disposed on the structural material 123 of the base member 121 utilizing any suitable process or technique, such as a deposition process (e.g., plating, printing, sputtering, spraying, etc.). Patterning can be utilized to provide gaps or spaces between the conductive layers and the exposed electrical routing features 130, such as the pads 131 and vias 132.

The bond material 142a, 142b (e.g., a solder material, an epoxy, etc.) can be disposed on the base member 121 (e.g., on conductive layer material) to facilitate coupling with the cover member 122. The bond material 142a, 142b can be disposed on the base member 121 in any suitable manner, such as a dispensing process. In addition, or alternatively, bond material 142a, 142b can be disposed on the cover member 122.

Figure 6B:
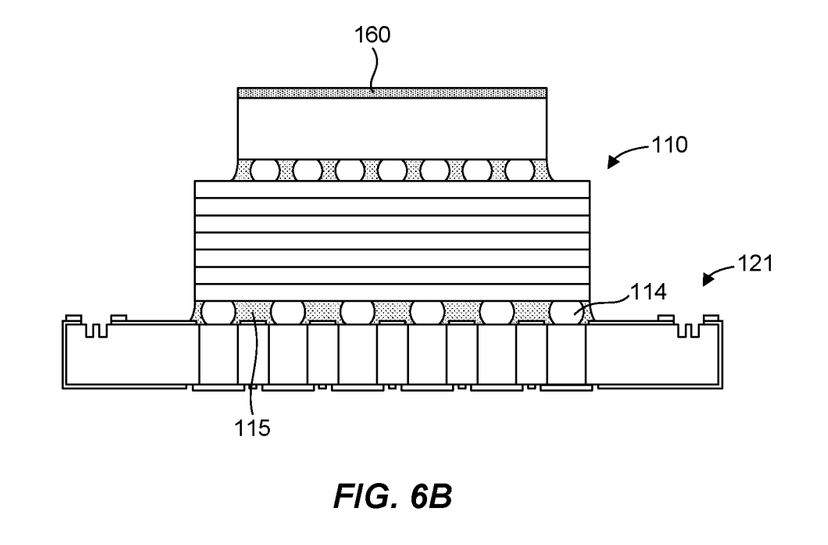

The electronic component 110 can be disposed on the base member 121, as shown in FIG. 6B, to electrically couple the electronic component 110 with the vias 132 of the base member 121. The electronic component 110 can be disposed on the base member 121 in any suitable manner, such as utilizing surface mounting technology (SMT) and reflowing the solder balls 114. The electronic component 110 can be manufactured utilizing any suitable technique or process known in the art. Underfill material 115 (e.g., an epoxy) can be disposed (e.g., dispensed) about the solder balls 114 between the electronic component 110 and the base member 121 and then cured. Thermally conductive material 160 can be disposed on the electronic component 110 such that the thermally conductive material 160 will be between the electronic component 110 and the cover member 122. In addition, or alternatively, thermally conductive material 160 can be disposed on the cover member 122. If desired, a mold compound (not shown) can be disposed at least partially about the electronic component 110 to encapsulate the electronic component 110.

Figure 6C:
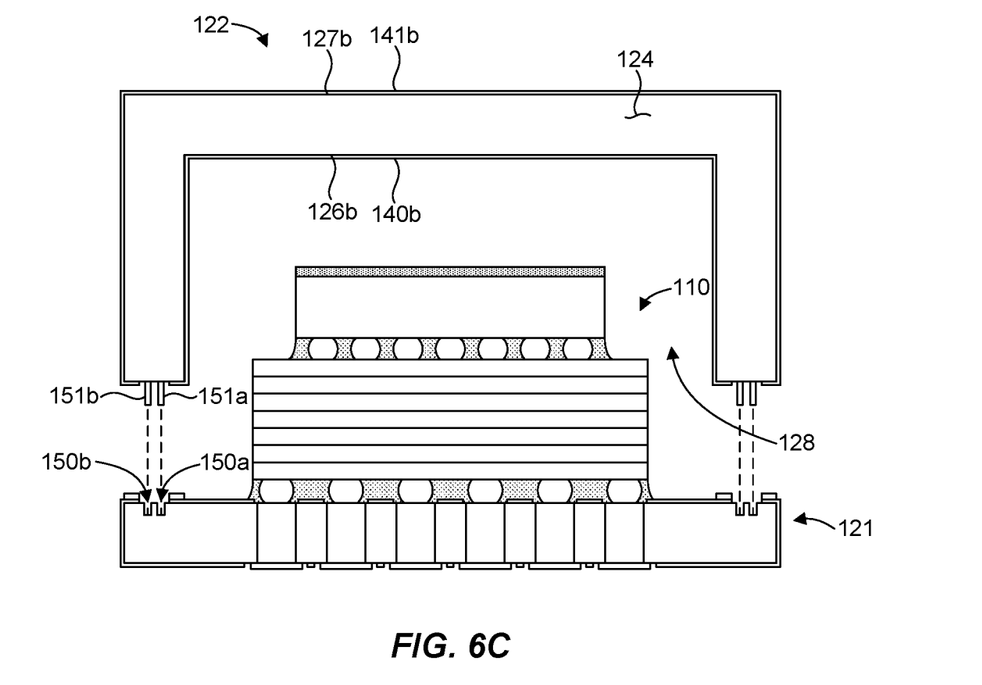

The cover member 122 shown in FIG. 6C can be constructed in any suitable manner. For example, the recess 128 can be formed in the structural material 124 of the cover member 122 in any suitable manner, such as by molding, milling, drilling, etc.

The protrusions 151a, 151b can be formed on the cover member 122 in any suitable manner. For example, a suitable metal material, ceramic material, and/or a polymer material can be formed as a protrusion and bonded to the structural material 124 of the cover member 122. If the protrusions 151a, 151b are formed of a metal material, such as copper, the metal material can be deposited on the structural material 124 of the cover member 122 by a suitable process (e.g., plating, printing, sputtering, spraying, etc.). Patterning can be utilized to define the shape, size, and/or location of the protrusions 151a, 151b. In addition, or alternatively, protrusions can be formed on the base member 121.

Electrically conductive material, such as copper, can be disposed on the inner and outer surfaces 126b, 127b of the structural material 124 of the cover member 122 to form the electrically conductive layers 140b, 141b. Electrically conductive material can be disposed on the structural material 124 of the cover member 122 utilizing any suitable process or technique, such as a deposition process (e.g., plating, printing, sputtering, spraying, etc.). Patterning can be utilized to accommodate the protrusions 151a, 151b.

Figure 6D:
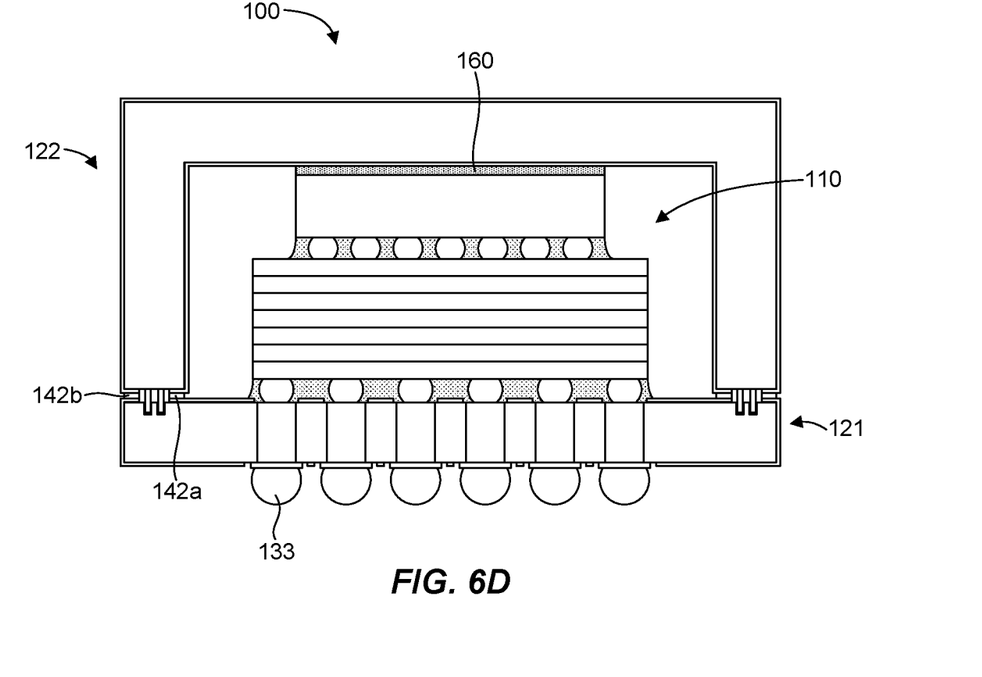

The cover member 122 can be disposed on the base member 121 to form an enclosure for the electronic component 110 by inserting the protrusions 151a, 151b of the cover member 122 into the mating receptacles 150a, 150b of the base member 121, as shown in FIGS. 6C and 6D, which can facilitate alignment of the base and cover members 121, 122. The base member 121 and the cover member 122 can then be mechanically coupled to one another. This can be accomplished utilizing the bond material 142a, 142b. If the bond material 142a, 142b is solder material, then the base member 121 and the cover member 122 can be mechanically coupled to one another by soldering (e.g., reflowing the solder material between the base and cover members 121, 122). This can hermetically seal an interface of the base member 121 and the cover member 122. The thermally conductive material 160 can be in contact with the electronic component 110 and the cover member 122. The solder balls 133 can be added to the base member 121 to provide for surface mounting of the electronic device package 100 to a next level component (e.g., a motherboard or other circuit board).

Figure 7:
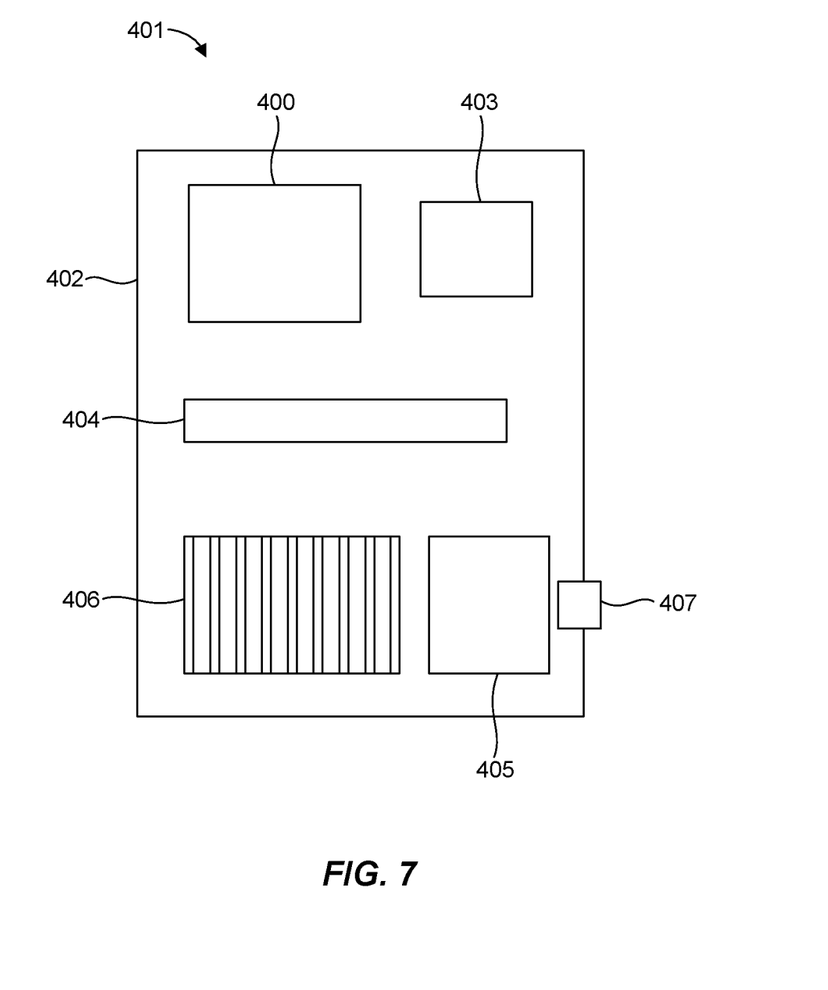
FIG. 7 is a schematic illustration of an exemplary computing system.

FIG. 7 schematically illustrates an example computing system 401. The computing system 401 can include an electronic device package 400 as disclosed herein, coupled to a motherboard 402. In one aspect, the computing system 401 can also include a processor 403, a memory device 404, a radio 405, a cooling system (e.g., a heat sink and/or a heat spreader) 406, a port 407, a slot, or any other suitable device or component, which can be operably coupled to the motherboard 402. The computing system 401 can comprise any type of computing system, such as a desktop computer, a laptop computer, a tablet computer, a smartphone, a server, a wearable electronic device, a radio module, etc. Other embodiments need not include all the features specified in FIG. 7, and may include alternative features not specified in FIG. 7.

A radio module may be utilized in 5G systems, autonomous vehicles, connected vehicles, etc. Millimeter wave 5G system may be installed in base stations operating in extreme outdoor weather conditions. Autonomous or connected vehicles may operate in harsh environments (high temperature, humidity, mechanical vibration etc.). Radio modules utilized in such systems may benefit from being hermetically sealed, shielded, mechanically stable, and capable of operating at higher temperatures, which are attributes that may be provided by the electronic device packages disclosed herein.

Examples

The following examples pertain to further embodiments.

In one example there is provided, an electronic device package, comprising: a base member having vias extending therethrough; an electronic component disposed on the base member and electrically coupled to the vias; and a cover member disposed on the base member such that the cover member and the base member form an enclosure for the electronic component, wherein the vias are configured to electrically couple the electronic component with another electronic component external to the enclosure.

In one example there is provided, an electronic device package, comprising: an electronic component; a base member supporting the electronic component; and a cover member disposed on the base member such that the cover member and the base member enclose the electronic component, wherein the cover member includes a protrusion, a receptacle, or both, and the base member includes a mating protrusion, receptacle, or both to facilitate proper alignment of the cover member and the base member.

In one example, there is provided, an enclosure for an electronic component, comprising: a base member having at least one via extending therethrough; and a cover member configured to be disposed on the base member to form an enclosure for an electronic component, wherein the at least one via is configured to electrically couple an enclosed electronic component with another electronic component external to the enclosure.

In one example there is provided, an enclosure for an electronic component, comprising: a base member to support an electronic component; and a cover member configured to be disposed on the base member such that the cover member and the base member enclose the electronic component, wherein the cover member includes a protrusion, a receptacle, or both, and the base member includes a mating protrusion, receptacle, or both to facilitate proper alignment of the cover member and the base member.

In one example of an electronic package device, or an enclosure for an electronic component, the base member and the cover member interface to form a hermetic seal.

In one example of an electronic package device, or an enclosure for an electronic component, the base member and the cover member are mechanically coupled to one another.

In one example of an electronic package device, or an enclosure for an electronic component, the base member and the cover member are mechanically coupled to one another with solder material.

In one example of an electronic package device, or an enclosure for an electronic component, the package or enclosure further comprises an electrically conductive layer disposed on each of the base member and cover member that forms an electromagnetic interference shield.

In one example of an electronic package device, or an enclosure for an electronic component, the electrically conductive layer is disposed on interior surfaces of the base member and the cover member.

In one example of an electronic package device, or an enclosure for an electronic component, the electrically conductive layer is disposed on exterior surfaces of the base member and the cover member.

In one example of an electronic package device, or an enclosure for an electronic component, the electrically conductive layer comprises a first electrically conductive layer disposed on interior surfaces of the base member and the cover member, and a second electrically conductive layer disposed on exterior surfaces of the base member and the cover member.

In one example of an electronic package device, or an enclosure for an electronic component, the base member has a flat configuration and the cover member has a recess to receive the electronic component.

In one example of an electronic package device, or an enclosure for an electronic component, the cover member comprises only a single recess.

In one example of an electronic package device, or an enclosure for an electronic component, the electronic component comprises a plurality of electronic components.

In one example of an electronic package device, or an enclosure for an electronic component, the electronic component comprises a plurality of electronic components, and the cover member comprises a plurality of recesses that form compartments with the base member for the plurality of electronic components.

In one example of an electronic package device, or an enclosure for an electronic component, the package device or enclosure further comprises an electrically conductive layer disposed on each of the base member and cover member that forms an electromagnetic interference shield.

In one example of an electronic package device, or an enclosure for an electronic component, the electrically conductive layer is disposed on interior surfaces of at least one of the compartments formed by the base member and the cover member.

In one example of an electronic package device, or an enclosure for an electronic component, the electrically conductive layer is disposed on exterior surfaces of the base member and the cover member.

In one example of an electronic package device, or an enclosure for an electronic component, the electrically conductive layer comprises a first electrically conductive layer disposed on interior surfaces of at least one of the compartments formed by the base member and the cover member, and a second electrically conductive layer disposed on exterior surfaces of the base member and the cover member.

In one example of an electronic package device, or an enclosure for an electronic component, the cover member includes a protrusion, a receptacle, or both, and the base member includes a mating protrusion, receptacle, or both to facilitate proper alignment of the cover member and the base member.

In one example of an electronic package device, or an enclosure for an electronic component, the protrusion comprises a wall, a post, or a combination thereof.

In one example of an electronic package device, or an enclosure for an electronic component, the wall comprises a plurality of parallel walls.

In one example of an electronic package device, or an enclosure for an electronic component, the receptacle comprises a slot, a hole, or a combination thereof.

In one example of an electronic package device, or an enclosure for an electronic component, the protrusion is formed of a metal material, a ceramic material, a polymer material, or a combination thereof.

In one example of an electronic package device, or an enclosure for an electronic component, the metal material comprises copper.

In one example of an electronic package device, or an enclosure for an electronic component, the protrusion comprises a wall, a post, or a combination thereof.

In one example of an electronic package device, or an enclosure for an electronic component, the wall comprises a plurality of parallel walls.

In one example of an electronic package device, or an enclosure for an electronic component, the receptacle comprises a slot, a hole, or a combination thereof.

In one example of an electronic package device, or an enclosure for an electronic component, the protrusion is formed of a metal material, a ceramic material, a polymer material, or a combination thereof.

In one example of an electronic package device, or an enclosure for an electronic component, the metal material comprises copper.

In one example of an electronic package device, or an enclosure for an electronic component, the vias are solid.

In one example of an electronic package device, or an enclosure for an electronic component, the vias are hollow.

In one example of an electronic package device, or an enclosure for an electronic component, the vias are formed of a metal material.

In one example of an electronic package device, or an enclosure for an electronic component, the metal material comprises copper, aluminum, nickel, gold, or a combination thereof.

In one example of an electronic package device, or an enclosure for an electronic component, the package device or enclosure further comprises a thermally conductive material disposed between the cover member and the electronic component.

In one example of an electronic package device, or an enclosure for an electronic component, the electronic component comprises a flip chip package, a wire bond chip package, or a combination thereof.

In one example, there is provided a computing system, comprising: a motherboard; and an electronic device package as recited herein operably coupled to the motherboard.

In one example of a computing system, the system comprises a desktop computer, a laptop, a tablet, a smartphone, a server, a wearable electronic device, a computer card, a radio module, or a combination thereof.

In one example of a computing system, the system further comprises a processor, a memory device, a cooling system, a radio, a slot, a port, or a combination thereof operably coupled to the motherboard.

In one example, there is provided a method for making an electronic device package, comprising: electrically coupling an electronic component with vias of a base member; and disposing a cover member on the base member such that the cover member and the base member form an enclosure for the electronic component, wherein the vias extend through the base member to electrically couple the electronic component with another electronic component external to the enclosure.

In one example there is provided a method for making an electronic device package, comprising: disposing an electronic component on a base member; and disposing a cover member on the base member such that the cover member and the base member form an enclosure for the electronic component, wherein the cover member includes a protrusion, a receptacle, or both, and the base member includes a mating protrusion, receptacle, or both to facilitate proper alignment of the cover member and the base member.

In one example of a method for making an electronic device package, the method further comprises hermetically sealing an interface of the base member and the cover member.

In one example of a method for making an electronic device package, the method further comprises mechanically coupling the base member and the cover member to one another.

In one example of a method for making an electronic device package, the method further comprises mechanically coupling the base member and the cover member to one another comprises soldering.

In one example of a method for making an electronic device package, the method further comprises disposing an electrically conductive layer on each of the base member and cover member to form an electromagnetic interference shield.

In one example of a method for making an electronic device package, the electrically conductive layer is disposed on interior surfaces of the base member and the cover member.

In one example of a method for making an electronic device package, the electrically conductive layer is disposed on exterior surfaces of the base member and the cover member.

In one example of a method for making an electronic device package, disposing an electrically conductive layer comprises disposing a first electrically conductive layer on interior surfaces of the base member and the cover member, and disposing a second electrically conductive layer on exterior surfaces of the base member and the cover member.

In one example of a method for making an electronic device package, the base member has a flat configuration and the cover member has a recess to receive the electronic component.

In one example of a method for making an electronic device package, the cover member comprises only a single recess.

In one example of a method for making an electronic device package, the electronic component comprises a plurality of electronic components.

In one example of a method for making an electronic device package, the electronic component comprises a plurality of electronic components, and the cover member comprises a plurality of recesses that form compartments with the base member for the plurality of electronic components.

In one example of a method for making an electronic device package, the method further comprises disposing an electrically conductive layer on each of the base member and cover member to form an electromagnetic interference shield.

In one example of a method for making an electronic device package, the electrically conductive layer is disposed on interior surfaces of at least one of the compartments formed by the base member and the cover member.

In one example of a method for making an electronic device package, the electrically conductive layer is disposed on exterior surfaces of the base member and the cover member.

In one example of a method for making an electronic device package, disposing an electrically conductive layer comprises disposing a first electrically conductive layer on interior surfaces of at least one of the compartments formed by the base member and the cover member, and disposing a second electrically conductive layer on exterior surfaces of the base member and the cover member.

In one example of a method for making an electronic device package, the cover member includes a protrusion, a receptacle, or both, and the base member includes a mating protrusion, receptacle, or both to facilitate proper alignment of the cover member and the base member.

In one example of a method for making an electronic device package, the protrusion comprises a wall, a post, or a combination thereof.

In one example of a method for making an electronic device package, the wall comprises a plurality of parallel walls.

In one example of a method for making an electronic device package, the receptacle comprises a slot, a hole, or a combination thereof.

In one example of a method for making an electronic device package, the protrusion is formed of a metal material, a ceramic material, a polymer material, or a combination thereof.

In one example of a method for making an electronic device package, the metal material comprises copper.

In one example of a method for making an electronic device package, the vias are solid.

In one example of a method for making an electronic device package, the vias are hollow.

In one example of a method for making an electronic device package, the vias are formed of a metal material.

In one example of a method for making an electronic device package, the metal material comprises copper, aluminum, nickel, gold, or a combination thereof.

In one example of a method for making an electronic device package, the method further comprises disposing a thermally conductive material between the cover member and the electronic component.

In one example of a method for making an electronic device package, the electronic component comprises a flip chip package, a wire bond chip package, or a combination thereof.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
   a base member having vias extending therethrough;
   an electronic component disposed on the base member and electrically coupled to the vias, the electronic component including a die on a package substrate, the die attached to the package substrate by a plurality of solder balls or bumps, and the package substrate between the base member and the die; and
   a cover member disposed on the base member such that the cover member and the base member form an enclosure for the electronic component, wherein the cover member includes an end having a first protrusion and a second protrusion, the first protrusion spaced a first distance from an edge of the base member, and the second protrusion spaced a second distance from the edge of the base member, the first distance less than the second distance, and the base member includes a mating receptacle, the mating receptacle extending only partially through the base member;
   wherein the vias are configured to electrically couple the electronic component with another electronic component external to the enclosure.

2. The electronic device package of claim 1, wherein the base member and the cover member interface to form a hermetic seal.

3. The electronic device package of claim 1, wherein the base member and the cover member are mechanically coupled to one another.

4. The electronic device package of claim 1, further comprising an electrically conductive layer disposed on each of the base member and cover member that forms an electromagnetic interference shield.

5. The electronic device package of claim 1, wherein the base member has a flat configuration and the cover member has a recess to receive the electronic component.

6. The electronic device package of claim 1, wherein the vias are solid.

7. The electronic device package of claim 1, wherein the vias are hollow.

8. The electronic device package of claim 1, wherein the vias are formed of a metal material.

9. The electronic device package of claim 1, further comprising a thermally conductive material disposed between the cover member and the electronic component.

10. An electronic device package, comprising:
    an electronic component;
    a base member supporting the electronic component, the electronic component including a die on a package substrate, the die attached to the package substrate by a plurality of solder balls or bumps, and the package substrate between the base member and the die; and
    a cover member disposed on the base member such that the cover member and the base member enclose the electronic component,
    wherein the cover member includes an end having a first protrusion and a second protrusion, the first protrusion spaced a first distance from an edge of the base member, and the second protrusion spaced a second distance from the edge of the base member, the first distance less than the second distance, and the base member includes a mating receptacle to facilitate proper alignment of the cover member and the base member.

11. The electronic device package of claim 10, wherein the base member and the cover member interface to form a hermetic seal.

12. The electronic device package of claim 10, wherein the base member and the cover member are mechanically coupled to one another.

13. The electronic device package of claim 10, further comprising an electrically conductive layer disposed on each of the base member and cover member that forms an electromagnetic interference shield.

14. The electronic device package of claim 10, wherein the base member has a flat configuration and the cover member has a recess to receive the electronic component.

15. The electronic device package of claim 10, wherein the protrusion comprises a wall, a post, or a combination thereof.

16. The electronic device package of claim 10, wherein the receptacle comprises a slot, a hole, or a combination thereof.

17. The electronic device package of claim 10, wherein the protrusion is formed of a metal material, a ceramic material, a polymer material, or a combination thereof.

18. The electronic device package of claim 10, wherein the base member includes vias extending therethrough to electrically couple the electronic component with another electronic component external to the enclosure.

19. The electronic device package of claim 10, further comprising a thermally conductive material disposed between the cover member and the electronic component.

20. A method for making an electronic device package, comprising:
    electrically coupling an electronic component with vias of a base member, the electronic component including a die on a package substrate, the die attached to the package substrate by a plurality of solder balls or bumps, and the package substrate between the base member and the die; and
    disposing a cover member on the base member such that the cover member and the base member form an enclosure for the electronic component, wherein the cover member includes an end having a first protrusion and a second protrusion, the first protrusion spaced a first distance from the edge of the base member, and the second protrusion spaced a second distance from an edge of the base member, the first distance less than the second distance, and the base member includes a mating receptacle, the mating receptacle extending only partially through the base member;
    wherein the vias extend through the base member to electrically couple the electronic component with another electronic component external to the enclosure.

21. The method of claim 20, further comprising hermetically sealing an interface of the base member and the cover member.

22. The method of claim 20, further comprising mechanically coupling the base member and the cover member to one another.

23. The method of claim 22, wherein mechanically coupling the base member and the cover member to one another comprises soldering.

\* \* \* \* \*